United States Patent [19]
Chen et al.

[11] Patent Number: 6,064,486
[45] Date of Patent: May 16, 2000

[54] SYSTEMS, METHODS AND COMPUTER PROGRAM PRODUCTS FOR DETECTING THE POSITION OF A NEW ALIGNMENT MARK ON A SUBSTRATE BASED ON FITTING TO SAMPLE ALIGNMENT SIGNALS

[75] Inventors: Xun Chen, Sunnyvale; Amir A. Ghazanfarian, Stanford; Mark A. McCord, Mountain View; R. Fabian W. Pease, Menlo Park; Thomas Kailath, Stanford, all of Calif.

[73] Assignee: Leland Stanford Junior University, Palo Alto, Calif.

[21] Appl. No.: 09/082,851

[22] Filed: May 21, 1998

[51] Int. Cl.$^7$ .................................................. G01B 9/02
[52] U.S. Cl. .............................. 356/401; 356/399; 430/22
[58] Field of Search ................................ 356/401, 399; 430/22

[56] References Cited

U.S. PATENT DOCUMENTS

| | | | |
|---|---|---|---|
| 4,886,974 | 12/1989 | Ina | 250/561 |
| 5,329,354 | 7/1994 | Yamamoto et al. | 356/349 |
| 5,657,129 | 8/1997 | Nishi | 356/401 |
| 5,674,650 | 10/1997 | Dirksen et al. | 430/22 |
| 5,680,200 | 10/1997 | Sugaya et al. | 355/53 |
| 5,682,243 | 10/1997 | Nishi | 356/401 |
| 5,684,595 | 11/1997 | Kato et al. | 356/401 |
| 5,734,594 | 3/1998 | Chu et al. | 364/559 |

OTHER PUBLICATIONS

Ghazanfarian et al., "Exploiting Structure of Wafer Distortion in Global Alignment", IEEE Conference on Acoustics, Speech and Signal Processing, May 12, 1998.

Ghazanfarian et al., "High Accuracy Alignment Based on Subspace Decomposition", SPIE International Symposium on Microlithography, Feb. 1998.

Ghazanfarian et al., "Neural Network Model for Global Alignment Incorporating Wafer and Stage Distortion", J. Vac. Sci. Technol. B, vol. 15, No. 6, Nov./Dec. 1997, pp. 2146–2150.

Chen et al., "Accurate Alignment on Asymmetrical Signals", J. Vac. Sci. Technol. B, vol. 15, No. 6 Nov./Dec. 1997, pp. 2185–2188.

Ghazanfarian et al., "A New Approach to Glogal Alignment in IC Manufacturing Based on a Neural Network Model", SPIE's 22$^{nd}$ International Symposium on Microlithography, Mar. 9–14, 1997, 14 pp.

Dirksen et al., "Effect of Processing on the Overlay Performance of a Wafer Stepper", SPIE vol. 3050, 1997, pp. 102–113.

Hassibi et al., "H∞ Optimality of the LMS Algorithm", IEEE Transactions on Signal Processing, vol. 44, No. 2, Feb. 1996, pp. 267–280.

Ye et al, "Field Distortion Characterization Using Linwiedht of Pitch Measurement", J. Vac. Sci. Technol. B, vol. 13, No. 6, Nov./Dec. 1995, pp. 2904–2908.

Primary Examiner—Robert H. Kim
Assistant Examiner—Andrew H. Lee
Attorney, Agent, or Firm—Myers Bigel Sibley & Sajovec

[57] ABSTRACT

Systems, methods and computer program products detect a position of a new alignment mark on a substrate by producing an alignment signal model from sample alignment signals and fitting the new alignment signal to the alignment signal model. The alignment signal model may be produced from the multiple sample alignment signals using singular value decomposition, based on subspace decomposition of the alignment signals. By producing an alignment signal model from multiple sample alignment signals, asymmetries in the sample alignment marks and/or in the coatings that are fabricated on the sample alignment marks, may be taken into account when detecting the position of a new alignment mark.

48 Claims, 10 Drawing Sheets

SYSTEMS, METHODS AND COMPUTER PROGRAM PRODUCTS FOR DETECTING THE POSITION OF A NEW ALIGNMENT MARK ON A SUBSTRATE BASED ON FITTING TO SAMPLE ALIGNMENT SIGNALS

FEDERALLY SPONSORED RESEARCH

This invention was made with Government support under Air Force Office of Scientific Research Contract No. F49620- 95-1- 0525. The Government has certain rights to this invention.

FIELD OF THE INVENTION

This invention relates to integrated circuit manufacturing systems, methods and computer program products, and more particularly to integrated circuit alignment detecting systems, methods and computer program products.

BACKGROUND OF THE INVENTION

As the integration density and complexity of integrated circuits continues to increase, it may be increasingly difficult to properly align the patterned layers of an integrated circuit to one another. As is well known to those having skill in the art, integrated circuits are formed on an integrated circuit substrate, such as a semiconductor substrate, by sequentially patterning layers on the integrated circuit substrate. The registration accuracy of the layers to the substrate may be a limiting factor in the integration density of the integrated circuit and the number of layers that can be included in the integrated circuit. Accordingly, integrated circuit exposure tools including but not limited to proximity printers, projection printers, aligners and steppers, generally provide systems, methods and computer program products for aligning a pattern that is being projected to underlying patterns and/or to the underlying substrate.

Generally, alignment of one patterned layer to underlying layers may be performed with the assistance of special alignment marks that are designed into each mask level. When the alignment marks are aligned, it may be assumed that the remainder of the patterned layer is also properly aligned. Adjustment of the alignment marks was originally performed by human operators using a microscope. However, decreasing feature sizes and the increasing number of alignments per wafer have contributed to the development of automatic alignment for exposure tools. See, for example, U.S. Pat. No. 5,734,594 to Chu et al., entitled "Method and System for Enhancement of Wafer Alignment Accuracy"; U.S. Pat. No. 5,684,595 to Kato et al. entitled "Alignment Apparatus and Exposure Apparatus Equipped Therewith"; U.S. Pat. No. 5,682,243 to Nishi entitled "Method of Aligning a Substrate "; U.S. Pat. No. 5,680,200 to Sugaya et al. entitled "Inspection Apparatus and Method for Optical System, Exposure Apparatus Provided With the Inspection Apparatus, and Alignment Apparatus and Optical System Thereof Applicable to the Exposure Apparatus"; U.S. Pat. No. 5,674,650 to Dirksen et al. entitled "Method of Repetitively Imaging a Mask Pattern on a Substrate, and Apparatus for Performing the Method"; and U.S. Pat. No. 5,657,129 to Nishi entitled "Method and Apparatus for Alignment of a Substrate".

In conventional automated alignment, an alignment mark for a layer is imaged, for example by scanning the alignment mark or by using a camera to image the alignment mark. The imaged alignment mark may be used to produce an alignment signal. The center of the alignment signal is then determined and this center position is used to align the alignment mark to an underlying alignment mark, or to a reference position in the exposure tool's coordinate system.

Unfortunately, the alignment mark may not be symmetrical, thereby making it more difficult to find the center position of the alignment mark. Moreover, even if the alignment mark is symmetrical, subsequent processing which places a coating including one or more layers on the alignment mark and/or misalignment, aberration or uneven illumination of the alignment subsystem optics, may produce an asymmetrical alignment signal.

For example, the alignment mark may be a mesa or a trench on an integrated circuit substrate. One or more layers may form a coating on the substrate. The layers may be formed asymmetrically on the alignment mark, due to the topography of the trench or mesa and/or due to asymmetries in the coating forming process. In one specific example, Chemical Mechanical Polishing (CMP) is widely used to planarize a coating. The CMP process may give rise to asymmetry in the coating. Other processes, such as metal deposition and photoresist coating may also produce asymmetries. When detecting the alignment mark by imaging through the coating, these asymmetries may make it difficult to accurately define the center of the asymmetric alignment signal.

One technique for detecting the center of an alignment signal is described in U.S. Pat. No. 4,886,974 to Ina entitled "Mark Detecting Device for Detecting the Center of a Mark by Detecting Its Edges". In this patent, a device detects the center of an alignment mark in accordance with a photoelectrically-obtained signal, while taking into account the degree of asymmetry of the signal obtained at the time of optical scanning of the mark. First and second signals related to first and second edges of the alignment mark are detected. The detected first and second signals are added to produce a resultant signal, and the resultant signal is processed in accordance with any difference between the first and second signals, to determine the position of the alignment mark.

However, notwithstanding the above-described techniques, there continues to exist a need for improved systems, methods and computer program products for detecting the position of an alignment mark, notwithstanding asymmetries in the alignment mark, fabrication process-induced asymmetries in a coating on the alignment mark, and/or misalignment, aberration or uneven illumination of the alignment subsystem optics.

SUMMARY OF THE INVENTION

The present invention includes systems, methods and computer program products that detect a position of a new alignment mark on a substrate by producing an alignment signal model from a plurality of sample alignment signals and fitting the new alignment signal to the alignment signal model. By producing an alignment signal model from multiple sample alignment signals, asymmetries in the sample alignment marks and/or in the coatings that are fabricated on the sample alignment marks and/or misalignment, aberration or uneven illumination of the alignment subsystem optics, may be taken into account when detecting the position of the new alignment mark. Accordingly, accurate detection of the position of an alignment mark may be obtained.

More specifically, according to the invention, a plurality of sample alignment signals are obtained from a plurality of sample alignment marks. An alignment signal model is produced from the plurality of sample alignment signals. A new alignment signal is then generated from the new alignment mark. The new alignment signal is fitted to the alignment signal model, to thereby identify the position of the new alignment mark on the substrate.

Preferably, the sample alignment marks have the same shape as the new alignment mark and are fabricated using the same fabrication process as the new alignment mark. More specifically, the plurality of sample alignment marks having the shape are formed on at least one substrate, and the plurality of sample alignment marks are processed according to a fabrication process to produce a coating on the sample alignment marks. The plurality of sample alignment marks including the coating are imaged, to thereby generate the plurality of sample alignment signals.

The new alignment mark having the shape is formed on a substrate and the new alignment mark is processed according to the fabrication process to produce the coating on the new alignment mark. The new alignment mark including the coating is then imaged to generate the new alignment signal. The alignment mark and the new alignment mark may be asymmetrical. Alternatively, the sample alignment marks and the new alignment marks may be symmetrical, but the coating may be asymmetrical, such that the plurality of sample alignment signals and the new alignment signal are asymmetrical. Both the alignment marks and the coating may also be asymmetrical. The alignment marks may be formed by forming a mesa or trench on an integrated circuit substrate.

Preferably, the alignment signal model having a known position identification is produced from the plurality of sample alignment signals. The new alignment signal is fitted to the alignment signal model, to thereby identify the position of the new alignment mark on the substrate from the known position identification.

The alignment signal model may be produced from the plurality of sample alignment signals using singular value decomposition, based on subspace decomposition of the alignment signals. More specifically, a singular value decomposition of the plurality of sample alignment signals is computed, to thereby produce a plurality of base signals. The number of base signals that construct the sample alignment signals is determined, and the determined number of base signals is selected from the plurality of base signals, to thereby define the alignment signal model.

Preferably, the singular value decomposition of the plurality of sample alignment signals is computed, to thereby produce a plurality of base signals in descending order of importance. A minimum number of base signals is then determined that construct the sample alignment signals. The determined minimum number of base signals is selected from the plurality of base signals, beginning with the first base signal, to define the alignment signal model.

The new alignment signal is then fitted to the alignment signal model by repeatedly shifting the new alignment signal and determining an error of fitting the shifted new alignment signal to the alignment signal model, until a position of the shifted new alignment signal is identified having a minimum error of fitting. More specifically, the error of fitting is determined by determining an error of fitting the shifted new alignment signal to a linear combination of the determined minimum number of base signals that comprise the alignment signal model. The position of the shifted new alignment signal having a minimum error of fitting is thereby identified as the position of the new alignment mark on the substrate.

Accordingly, learning techniques may be used on sample alignment marks, to thereby determine an alignment signal model that takes into account process-induced asymmetries. Fitting techniques are then used to fit a new alignment signal to the alignment signal model, and thereby identify the position of a new alignment mark on a substrate. High accuracy position determination can thereby be obtained. It will be understood that the present invention may be provided as systems (apparatus), methods and/or computer program products.

DETAILED DESCRIPTION OF PREFERRED EMBODIMENTS

Figure 1A:
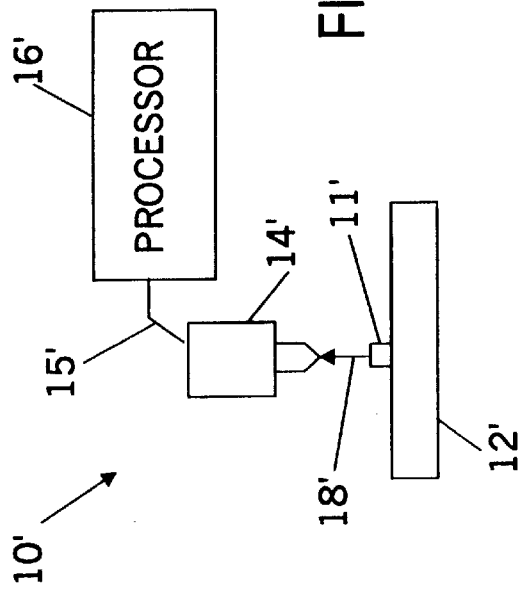
FIGS. 1A and 1B are simplified block diagrams of alignment subsystems of exposure tools according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. For example, when an alignment mark is referred to as being on a substrate, it may be directly on the substrate, or intervening layers may be present.

Figure 1B:
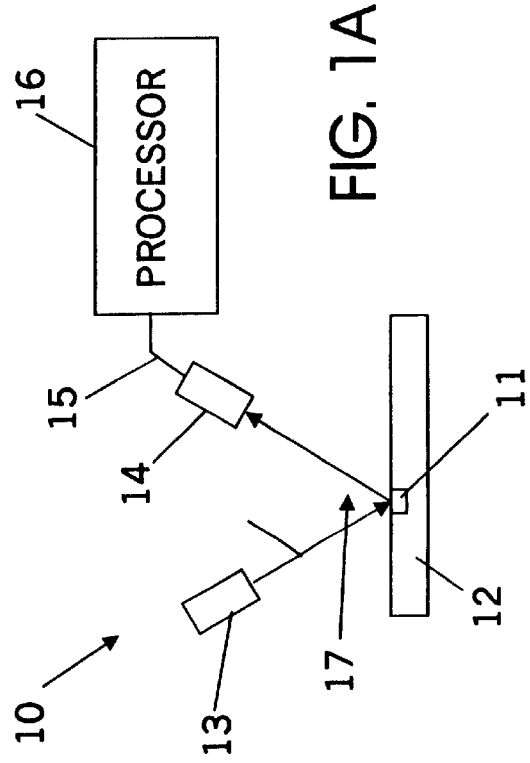

Referring now to FIGS. 1A and 1B, simplified block diagrams of exposure tools according to the present invention will now be described. The electrical, mechanical and optical design of exposure tools are well known to those having skill in the art, as evidenced by the above-cited U.S. patents and by the many exposure tools that are presently being marketed. Accordingly, FIGS. 1A and 1B provide conceptual block diagrams of exposure tools that detect a position of a new alignment mark on a substrate according to the present invention.

Referring now to FIG. 1A, an alignment subsystem of an exposure tool 10 detects the position of an alignment mark 11 on a substrate 12, by imaging the substrate 12 including the alignment mark 11. The alignment mark 11 is imaged using an optical system including a radiation source 13 and a radiation detector 14, to produce an alignment signal 15 that is processed in a processor 16. In the tool 10, the imaging radiation 18 that emerges from source 13 is scanned across alignment mark 11 in a direction shown by arrow 17. Alternatively, the substrate 12 can be moved relative to the radiation 18 or both the radiation 18 and the substrate can be moved. Radiation source 13 may emit optical, laser, electron beam or other radiation 18, and the radiation that is scattered from the alignment mark 11 is detected by an appropriate detector 14.

The alignment signal 15 that is produced by the detector 14 is processed in the processor 16. It will be understood by those having skill in the art that the processor 16 may be a microprocessor, an Application-Specific Integrated Circuit (ASIC), or any other combination of hardware and/or software. It will also be understood by those having skill in the art that the processor 16 may be designed as part of an existing processor of an exposure tool or a separate processor may be provided.

In FIG. 1B, the exposure tool 10' images the alignment mark 11' on the substrate 12' by capturing a two-dimensional or three-dimensional image of the alignment mark 11' using an image detector 14', such as a charge coupled device (CCD) camera to provide an alignment signal 15' to the processor 16'. In the exposure tool 10' of FIG. 1B, scanning of the radiation 18' relative to the substrate 12' need not be provided.

Figure 2A:
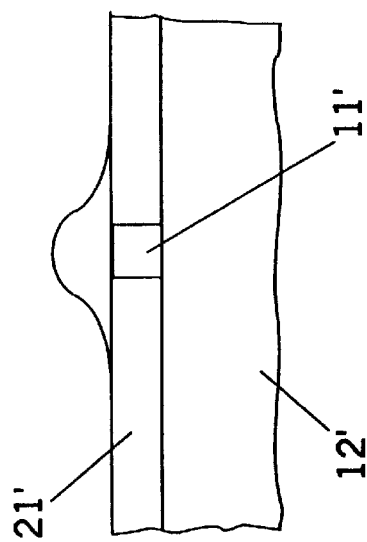
FIGS. 2A and 2B are enlarged views of portions of substrates including alignment marks according to the present invention.
Figure 2B:
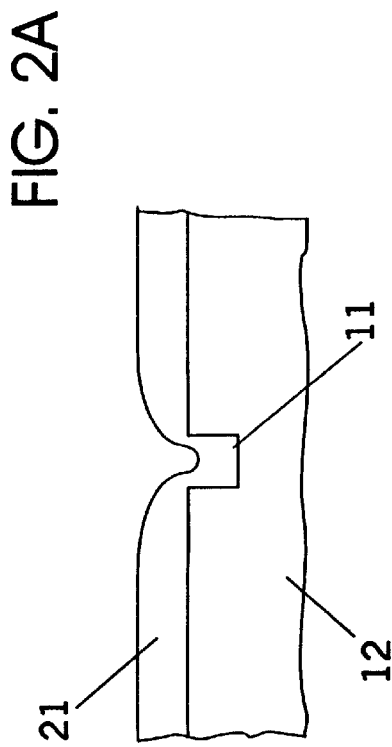

FIGS. 2A and 2B are enlarged views of a portion of substrates 12 and 12' respectively, including alignment marks 11 and 11' respectively. In microelectronic fabrication, the substrates 12 and 12' are preferably microelectronic substrates, such as monocrystalline semiconductor substrates which may comprise silicon, silicon carbide, gallium arsenide or other semiconductor materials. The substrate 12 may also be a thin semiconductor layer on an insulating layer using Semiconductor-On-Insulator (SOI) technology.

In FIG. 2A, the alignment mark 11 is a trench on the substrate 12. The trench may be 2 $\mu$m wide and 1 $\mu$m deep. In contrast, in FIG. 2B, the alignment mark 11' is a mesa on the substrate 12'. The mesa 11' may have comparable widths and heights to the width and depth of the trench 11. It will also be understood by those having skill in the art that although the alignment marks 11 and 11' are illustrated in cross-section, their actual shape may be in the form of crosses, chevrons or other shapes that are well known to those having skill in the art.

Figure 8:
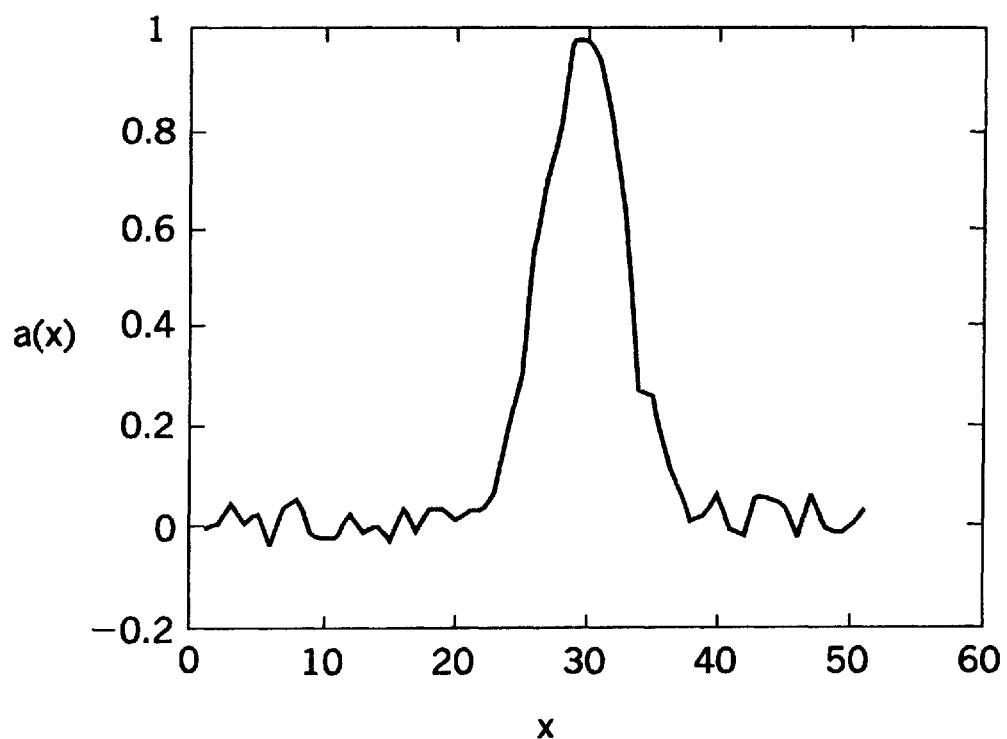
FIG. 8 graphically illustrates an alignment signal for an alignment mark including an asymmetric coating according to the present invention.

As also shown in FIGS. 2A and 2B, the alignment marks 11 and 11' are conventionally processed according to a fabrication process that forms active devices such as transistors in the substrates 12 and 12'. These fabrication processes produce a respective coating 21 and 21' on the respective substrates 12 and 12' including on the respective alignment marks 11 and 11'. As shown in FIGS. 2A and 2B, various processing conditions may produce an asymmetric coating on the topography of the alignment mark. These asymmetries may be produced due to asymmetric processing steps, such as photoresist coating or Chemical Mechanical Polishing (CMP). CMP may also be problematic because it may also reduce the contrast resulting in lower signal-to-noise ratio of the alignment signals 15 or 15'. FIG. 8 illustrates an alignment signal 15 or 15' that is obtained by imaging an alignment mark 11 or 11'. As shown, the signal is asymmetric due to the asymmetric coating 21 or 21' on the alignment mark. It will be understood by those having skill in the art that the coatings 21 and 21' may comprise a single layer or multiple layers.

Although the trend towards smaller features has been made possible by the use of higher resolution exposure tools, inaccurate alignment between different layers can limit the practicality of achieving such small features. Moreover, exposure tools generally need to expose multiple layers with accuracy. Alignment is typically obtained by imaging alignment marks on a substrate and determining the position of the alignment mark from the corresponding alignment signal. In the ideal case, the alignment mark is symmetric and so is the exposure tool that is used to image and detect the alignment signal. Therefore, the alignment signal will be symmetrical as well, and its center position may be well defined. However, as described above, processed alignment marks typically result in an asymmetric alignment signal, even when the underlying alignment mark is symmetric. It may be much more difficult to determine a center position of an asymmetric alignment mark.

According to the present invention, the position of a new alignment mark on a substrate may be detected by obtaining sample alignment signals from multiple sample alignment marks and producing an alignment signal model from the multiple sample alignment signals. The position of a new alignment mark is detected by generating a new alignment signal from the new alignment mark and fitting the new alignment signal to the alignment signal model, to thereby identify the position of the new alignment mark on a substrate.

It will also be understood that the alignment marks need not be primarily designed as alignment marks, but may have other uses as well. Thus, any pattern on a substrate may be used as an alignment mark. In fact, the present invention may facilitate the use of any pattern as an alignment mark because it can produce an alignment signal model from any circuit pattern and use the alignment signal model to identify the position of a new pattern. Stepper-specific alignment marks need not be used, and real estate on a substrate may be conserved.

It will also be understood that the present invention can detect a position of a new alignment mark on a substrate during an alignment phase of integrated circuit fabrication and during a metrology phase of integrated circuit fabrication. Specifically, overlay metrology is performed to determine how well one layer aligns to a previous layer. Thus, metrology compares an alignment mark, generally referred to as a metrology mark, on a current layer with an alignment mark on the previous layer, both of which are on a substrate. The metrology tool detects the alignment marks and determines the positions of the current and previous alignment marks. From these positions, an overlay may be calculated. Accordingly, the present invention may be used to detect the positions of the current and previous alignment marks during the metrology phase, as well as to detect the position of alignment marks during the alignment phase.

The present invention will now be described with respect to FIGS. 3–7, which are flowchart illustrations. It will be understood that each block of the flowchart illustrations, and combinations of blocks in the flowchart illustrations, can be implemented by computer program instructions. These computer program instructions may be provided to a processor 16 or 16' or other programmable data processing apparatus to produce a machine, such that the instructions which execute on the processor or other programmable data processing apparatus create means for implementing the functions specified in the flowchart block or blocks. These computer program instructions may also be stored in a computer-readable memory that can direct a processor or other programmable data processing apparatus to function in a particular manner, such that the instructions stored in the computer-readable memory produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based systems which perform the specified functions or steps such as was described in FIGS. 3–7, and/or by combinations of special purpose hardware and computer instructions.

Figure 3:
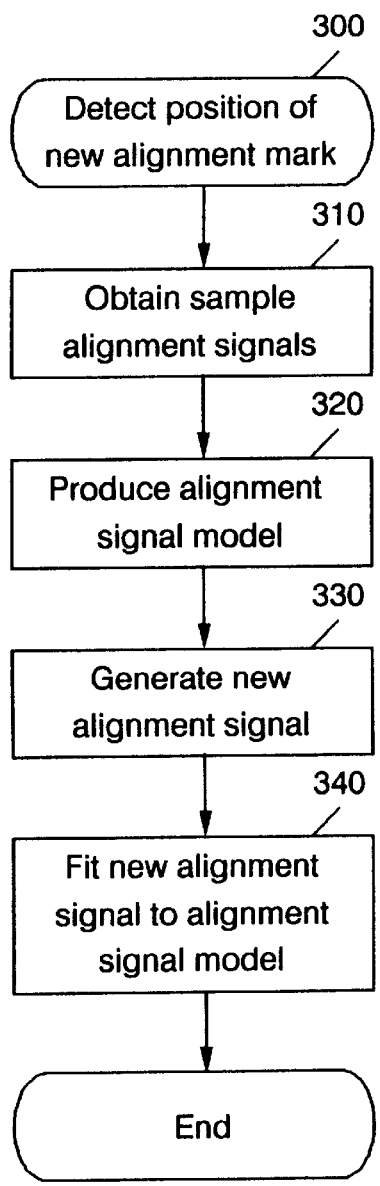
FIGS. 3–7 are flowcharts of detecting the position of a new alignment mark according to the present invention.

Referring now to FIG. 3, overall detection of a position of a new alignment mark on a substrate according to the present invention (Block 300) will now be described. Position detection is performed using the exposure tool 10 or 10' and the respective processor 16 or 16' according to the present invention. As shown in FIG. 3 at Block 310, a plurality of sample alignment signals are obtained from a plurality of sample alignment marks having the same shape as the new alignment mark. An alignment signal model is produced from the plurality of sample alignment signals at Block 320. A new alignment signal is generated from the new alignment mark at Block 330. At Block 340, the new alignment signal is fitted to the alignment signal model, to thereby identify the position of the new alignment mark on the substrate.

Each of Blocks 310–340 of flowchart 300 will now be described in detail in connection with FIGS. 4–7.

Figure 4:
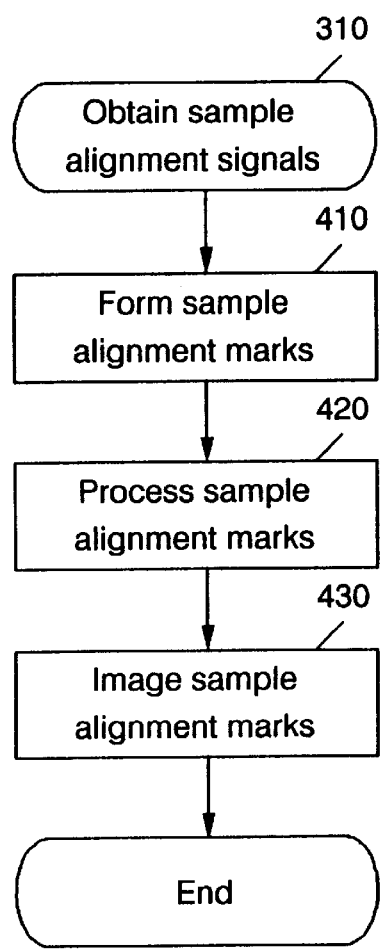

Referring now to FIG. 4, obtaining sample alignment signals (Block 310 of FIG. 3) will be described in greater detail. As shown in Block 410, a plurality of sample alignment marks having the same shape as the new alignment mark is formed on at least one substrate. It will be understood that multiple sample alignment marks may be formed on a single substrate, a single sample alignment mark may be formed on each of multiple substrates and/or multiple alignment marks may be formed on multiple substrates. The sample alignment marks may be mesas or trenches, as was already described in connection with FIGS. 1A through 2B.

At Block 420, the plurality of sample alignment marks having the same shape as the new alignment mark are processed according to a fabrication process to produce a coating on the sample alignment marks. As was already described in connection with FIGS. 2A and 2B, the coating may be asymmetrical, which may render it difficult to determine the center of the alignment mark. Finally, at Block 430, the plurality of sample alignment marks including the coating are imaged to generate a plurality of the sample alignment signals 15 and 15' of FIGS. 1A and 1B respectively. Imaging, whether by scanning, two-dimensional imaging or other techniques is well known to those having skill in the art and need not be described further herein.

Figure 5:
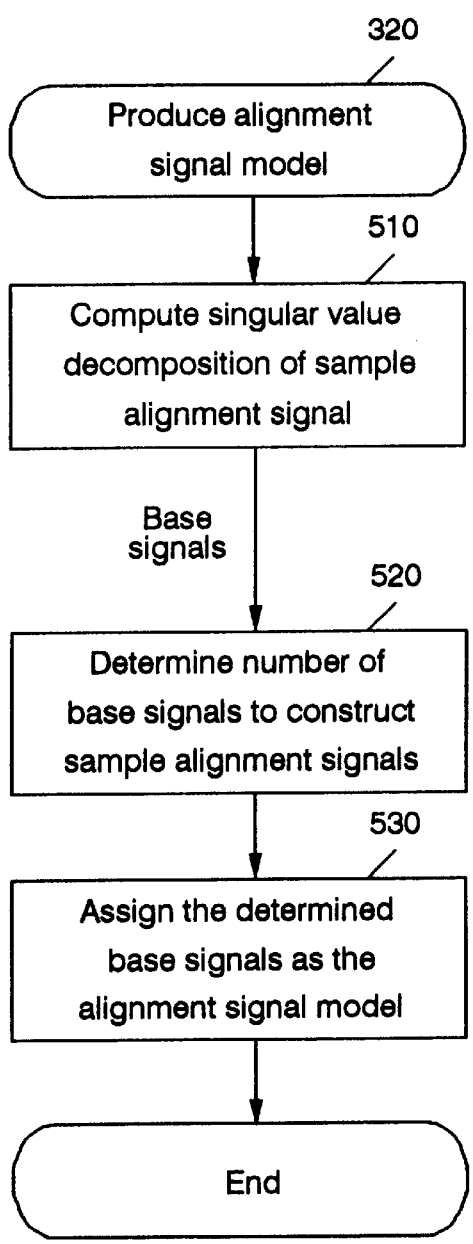

Referring now to FIG. 5, the production of an alignment signal model (Block 320 of FIG. 3) will now be described in more detail. In general, an alignment signal model may be produced based on subspace decomposition of the plurality of alignment signals. The subspace decomposition may assume that the process-induced variations are small enough such that only linear effects need to be considered.

More specifically, the exposure tool may behave as a low-pass filter with bandwidth proportional to NA/λ, where λ is the wavelength of the light, and NA is the numerical aperture. Therefore, there is an appropriate sampling rate above which the sampled discrete signal will have no aliasing. In practice, the signals may be oversampled.

The alignment signal is a function of the topography of the alignment mark and all the overlying layers, and therefore is a function of the physical parameters, such as temperature and pressure, of the processing steps. Since the processes are well-controlled, high order effects of the physical parameter variations may be ignored. Alternatively, high order effects of the physical parameter variations may be taken into account by taking a high order Taylor expansion. Accordingly:

$$a(x, \mu_1, \ldots, \mu_p) = a(x, \mu_1^0, \ldots, \mu_p^0) + \qquad (1)$$

$$\sum_{i=1}^{p} \Delta\mu_i \left. \frac{\partial a}{\partial \mu_i} \right|_{(\mu_1^0, \ldots, \mu_p^0)} (x) + n(x)$$

$$\equiv \sum_{i=0}^{p} \alpha_i a_i(x) + n(x)$$

where x is the variable along the scanning direction, n(x) is the additive noise, which also includes all the higher order terms, and $\{\mu_i\}$ are the physical parameters, which generally have small variations around their set-points, $\{\mu_i^0\}$. Also, $a_0(x) \equiv a(x, \mu_1^0, \ldots, \mu_p^0)$ and $$\left( a_i(x) \equiv \left. \frac{\partial a}{\partial \mu_i} \right|_{(\mu_1^0, \ldots, \mu_p^0)} (x) \right)$$

are defined. By introducing $\alpha_0$ as a variable, the varying gain of the optical system may be taken into account in comparing different alignment signals. The $\alpha_i(x)$, i=0, ..., p, may only depend on the set-points of the physical parameters, i.e. $\mu_1^0, \ldots, \mu_p^0$, and the alignment mark shape, which are generally fixed in a well-controlled process. Therefore, an alignment signal can be written as $$a(x; \mu_1, \ldots, \mu_p) = \sum_{i=0}^{p} \alpha_i a_i(x + \delta) + n(x) \qquad (2)$$

where δ is the relative position of the signal. The above analysis also assumes that the additive noise, n(x), is white. Thus, the position of a new alignment mark may be detected as follows: For a given signal a(x), find minimum p, $\alpha_i(x)$, i=0, ..., p, $\alpha_i$, i=0, ..., p, and δ, to fit the model in Equation (2).

Accordingly, in order to produce an alignment signal model, p and $\alpha_i(x)$, i=0, ..., p may be found since they depend on the process and not on a specific alignment signal.

Referring again to FIG. 5, singular value decomposition is used in order to determine a subspace of alignment signals. As shown in Block 510, a singular value decomposition of the plurality of sample alignment signals is computed, to thereby produce a plurality of base signals, preferably in the descending order of importance. More specifically, assume Block 310 produces m sample alignment signals along with their corresponding center positions. Without loss of generality, the signals may be assumed to be centered at the origin. Centering may be obtained by appropriately shifting the data. Therefore, m signals may be represented as $$a^{(j)}(x) = \sum_{i=0}^{p} \alpha_i^{(j)} a_i(x) + n^{(j)}(x), j = 1, \ldots, m \quad (3)$$

Equation (3) implies that $\alpha^{(j)}(x)$, $j=1, \ldots, m$ are m noisy signals of the subspace spanned by $\alpha_i(x)$, $i=0, \ldots, p$. To be more specific, assume that the measurement signals are also sampled at above the Nyquist rate. Hence, $n^{(j)}(x)$, $\alpha^{(j)}(x)$, $j=1, \ldots, m$, $\alpha_i(x)$, $i=0, \ldots, p$ may be replaced by the vectors $n^{(j)}$, $\alpha^{(j)}$, and $\alpha_i$ respectively and Equation (3) may be written as $$a^{(j)} = \sum_{i=0}^{p} \alpha_i^{(j)} a_i + n^{(j)}, j = 1, \ldots, m \quad (4)$$

Singular Value Decomposition (SVD) may then be used to generate base signals. SVD is described in detail in Golub et al., *"Matrix Computation"*, Johns Hopkins University Press, MD., 1984, the disclosure of which is hereby incorporated herein by reference. In general, let $F \in R^{M \times m}$, $M > m$, meaning F is an M×n matrix of real numbers. Then there exist unitary matrices $U \in R^{M \times M}$ and $V \in R^{m \times m}$ such that:

$$U^T F V = \text{diag}\{\sigma_1, \ldots, \sigma_m\} \equiv \Sigma \in R^{M \times m} \quad (5)$$

$\sigma_k$, $k=1, \ldots, m$, arranged in descending order, are known as the singular values of F, where $U^T$ is the transpose matrix of matrix U and diag $\{\ldots\}$ is a matrix with the given numbers on its diagonal and zero elsewhere. The corresponding decomposition of the matrix F is known as the Singular Value Decomposition(SVD) of F. It has been shown that U is the matrix of eigen vectors of $FF^T$, V is the matrix of eigen vectors of $F^T F$, and $\sigma_k$, $k=1, \ldots, m$ are the non-negative square roots of the eigenvalues of $F^T F$. If $V = \{v_{rs}\}$, $r, s=1, \ldots, m$, and $U = [u_1, \ldots, u_M]$, then F may be expressed as:

$$F = \left[ \sum_{i=1}^{m} (\sigma_i v_{1i}) u_i, \ldots, \sum_{i=1}^{m} (\sigma_i v_{mi}) u_i \right] \quad (6)$$

It may be seen that all the columns of F lie in the subspace spanned by $u_i$, $i=1, \ldots, m$.

When rank(F)=l<m, i.e. F is not full rank, then only the first l singular values are non-zero and the columns of F lie only in the subspace of $u_i$, $i=1, \ldots, l$. Note that the SVD of F finds both the dimension and a basis for the subspace spanned by its columns.

Referring again to FIG. 5, the use of the SVD of the sample alignment signals to produce a plurality of base signals in descending order of importance (Block 510) will now be described. As was previously described in Equation (4), m measurements, $a^{(j)}$, $j=1, \ldots, m$, where $a^{(j)} \in R^M$, $j=1, \ldots, m$ were obtained. If $F \equiv [a^{(1)}, \ldots, a^{(m)}]$ and assuming that the additive noise terms in Equation (4) are zero, Equation (4) can be rewritten as:

$$F = \left[ \sum_{i=0}^{p} \alpha_i^{(1)} a_i, \ldots, \sum_{i=0}^{p} \alpha_i^{(m)} a_i \right] \quad (7)$$

By comparing Equations (7) and (6), it may be determined that if $F \equiv [a^{(1)}, \ldots, a^{(m)}]$ and $F = U \Sigma V^T$ is its Singular Value Decomposition, then (p+1)=rank(F) and is the number of non-zero singular values of F, and $a_i = u_{(i+1)}$, $i=0, \ldots, p$. Thus, at Block 520, a determination of the number of base signals to construct the sample alignment signals is made. The dimension of the linear subspace p is the minimum number of base signals which can optimally construct all the sample alignment signals.

In the presence of additive noise, (p+1)=rank(F) will not necessarily apply. In other words, only (p+1) non-zero Singular Values may be obtained.

Suppose that $N \in R^{M \times m}$ is a random matrix with Gaussian distribution, zero mean with standard deviation σ, and all its elements are uncorrelated to each other. Then G=F+N will represent Equation (7) in the presence of noise to obtain:

$$E(G^T G) = E(F^T F + F^T N + N^T F + N^T N) \quad (8)$$
$$= F^T F + E(N^T N)$$
$$= F^T F + \sigma^2 I$$

where E( … ) is the expected value or the mean of a random variable. Therefore if $\sigma_k$, $k=1, \ldots, m$ are the singular values of F, and $\eta_k$, $k=1, \ldots, m$ are the eigenvalues of $E(G^T G)$, then $\eta_k = \sigma_k^2 + \sigma^2$, $k=1, \ldots, m$. Also, since $E(GG^T) = FF^T + \sigma^2 I$, $a_i$, $i=0, \ldots, p$, are the first (p+1) eigenvectors of $E(GG^T)$. Accordingly, at Block 530, the determined base signals are used as the alignment signal models. More specifically, the linear subspace of alignment signals is represented by the first p base signals. Accordingly, the alignment signal may comprise a plurality of alignment signals, such as p base signals.

The production of an alignment signal model (FIG. 5) may be summarized by the following operations:

1. Perform l measurements of m sample alignment marks to obtain m alignment signals per measurement (Block 310). Their corresponding center position identifications may also be acquired by metrology. Without loss of generality, all the sample alignment signals may be shifted such that they are centered at the ori Let $G_q \in R^{M \times m}$ be the qth measurement set. By choosing l large enough, $$E(GG^T) \cong \frac{1}{l} \sum_{q=1}^{l} G_q G_q^T \text{ and } E(G^T G) \cong \frac{1}{l} \sum_{q=1}^{l} G_q^T G_q.$$

2. Find the eigenvalues of $E(G^T G)$, $\eta_k$, $k=1, \ldots, m$, arranged in descending order. $\sigma = \eta_m$, and $\sigma_k = \sqrt{\eta_k - \sigma^2}$, $k=1, \ldots, m$; (p+1) is the number of $\sigma_k$, $k=1, \ldots, m$, that are non-zero (Block 510).

3. $a_j$, $j=0, \ldots, p$ are the first (p+1) eigenvectors of $E(GG^T)$ when their corresponding eigenvalues arranged in descending order (Block 520).

Figure 9:
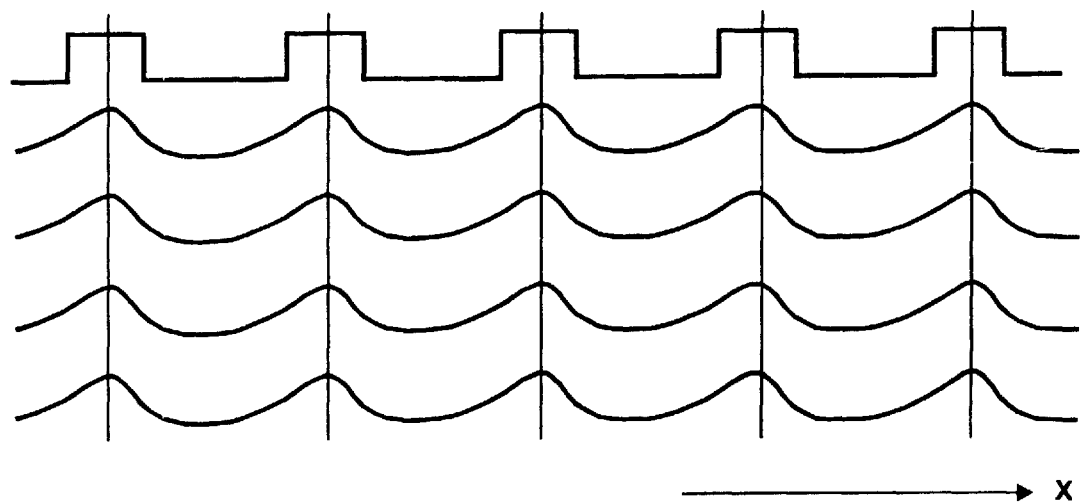
FIG. 9 graphically illustrates an example of sample alignment marks and scanning configurations according to the present invention.
Figure 10A:
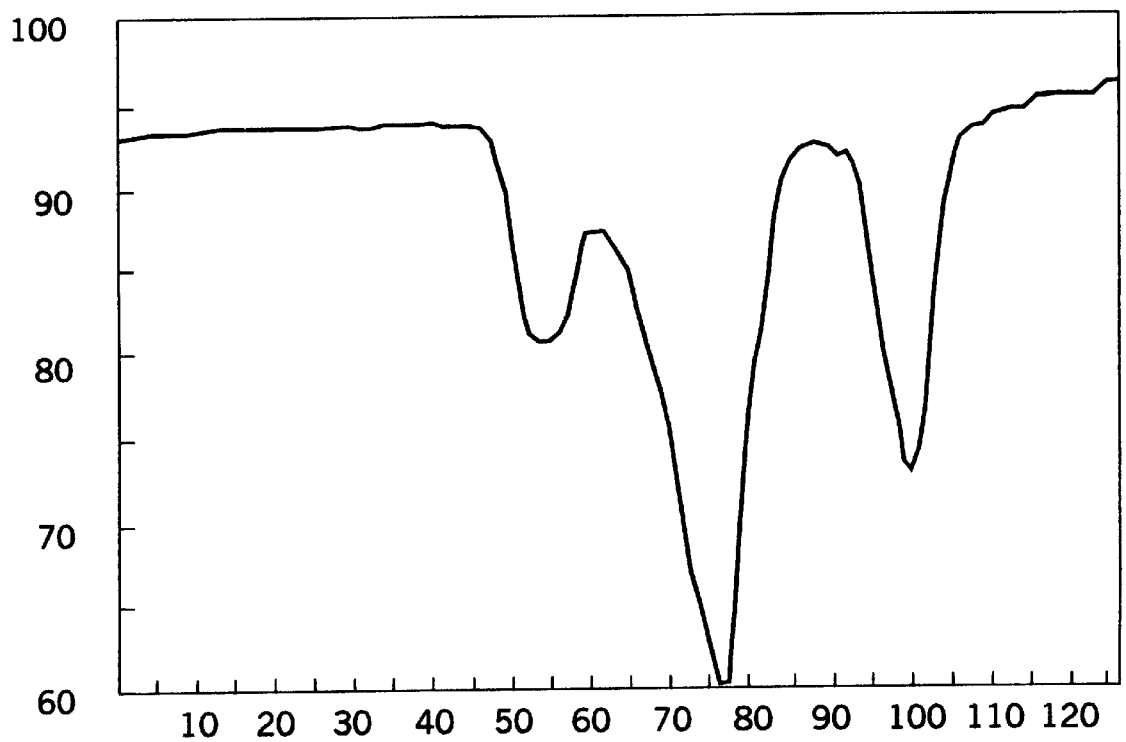
FIGS. 10A–10D illustrate sample alignment signals from distorted sample alignment marks.
Figure 10B:
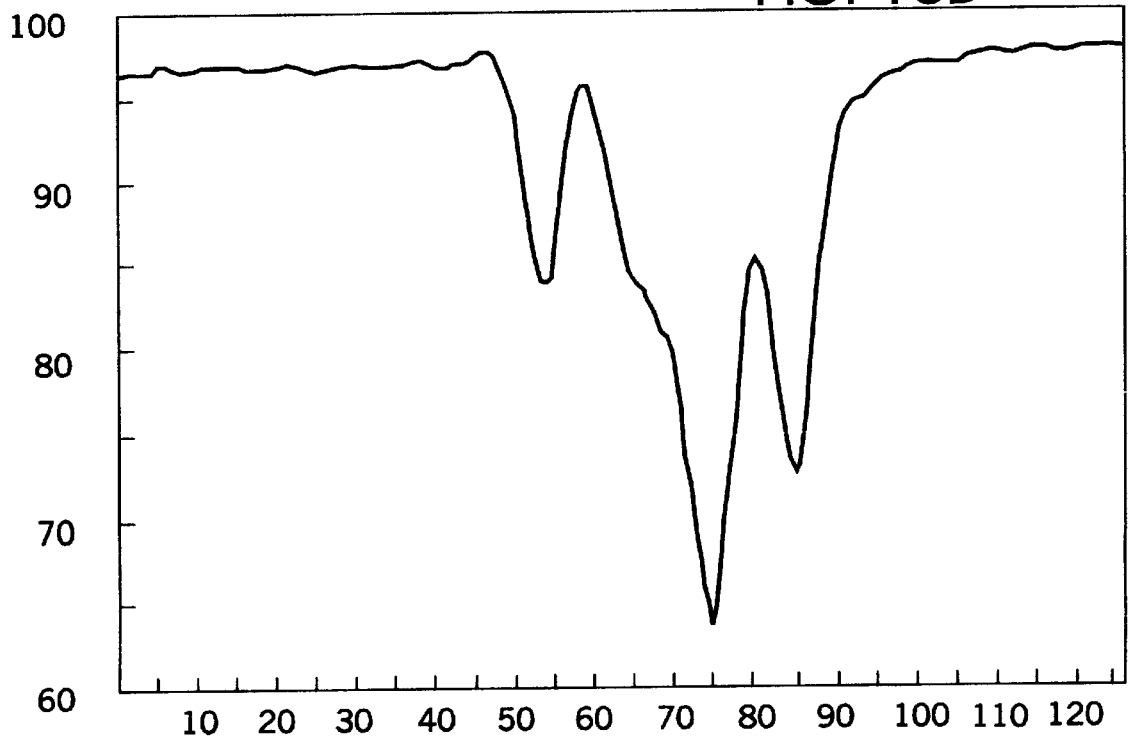
Figure 10C:
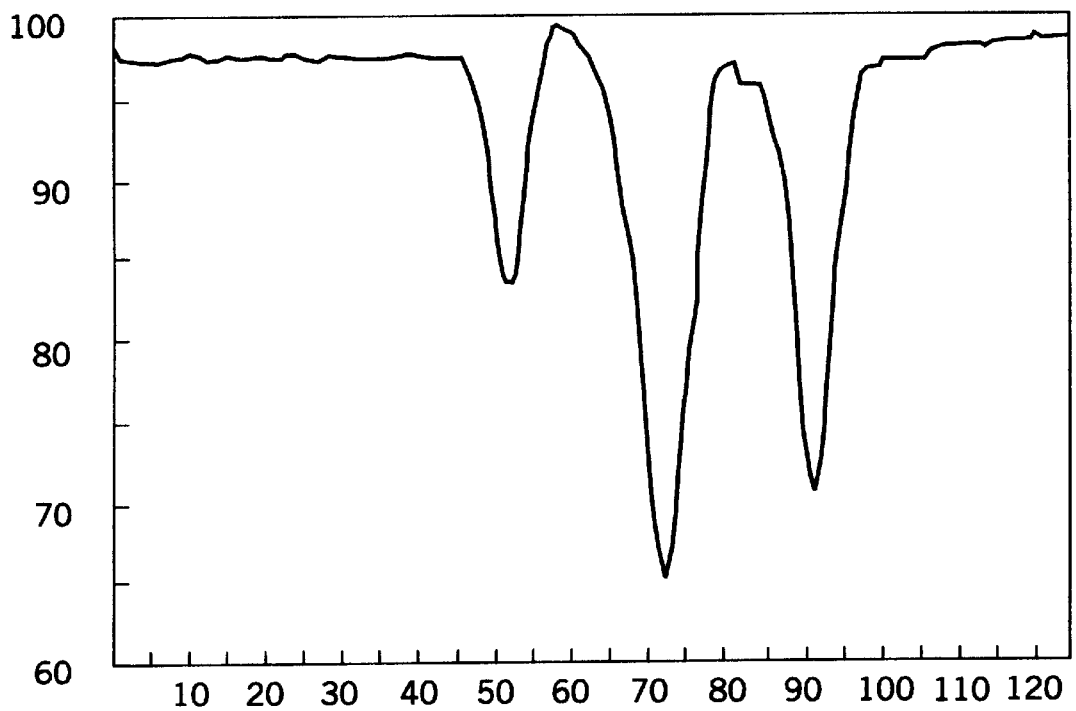
Figure 10D:
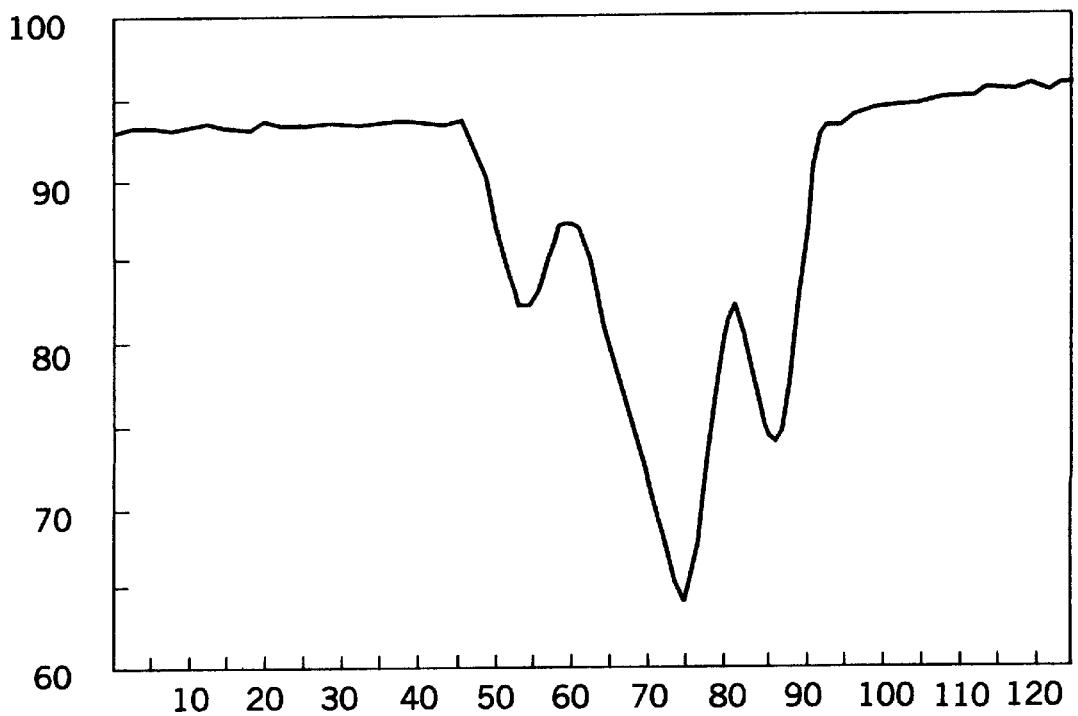

FIG. 9 depicts an example of sample alignment marks (top row) and sample alignment signals (bottom rows) for m=5 (five alignment marks) and l=4 (four scans). The position of the alignment signals shown in the vertical lines may be obtained through other experiments such as metrology, or by the exposure tool itself.

Figure 6:
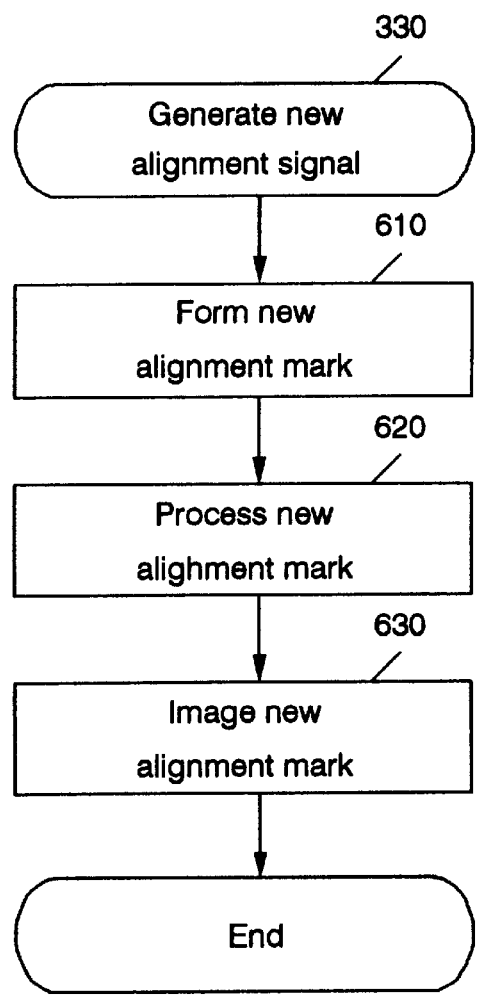

Referring now to FIG. 6, the generation of a new alignment signal (Block 330 of FIG. 3) will now be described. As shown at Block 610, the new alignment mark having the same shape as the sample alignment marks is formed on a substrate. At Block 620, the new alignment mark is processed according to the fabrication process of the sample alignment marks, to produce the coating on the new alignment mark. At Block 630, the new alignment mark including the coating is imaged to generate the new alignment signal. The formation of the new alignment mark, the processing of the new alignment mark, and the imaging of the new alignment mark preferably takes place in the same manner as the sample alignment marks, as was already described.

Figure 7:
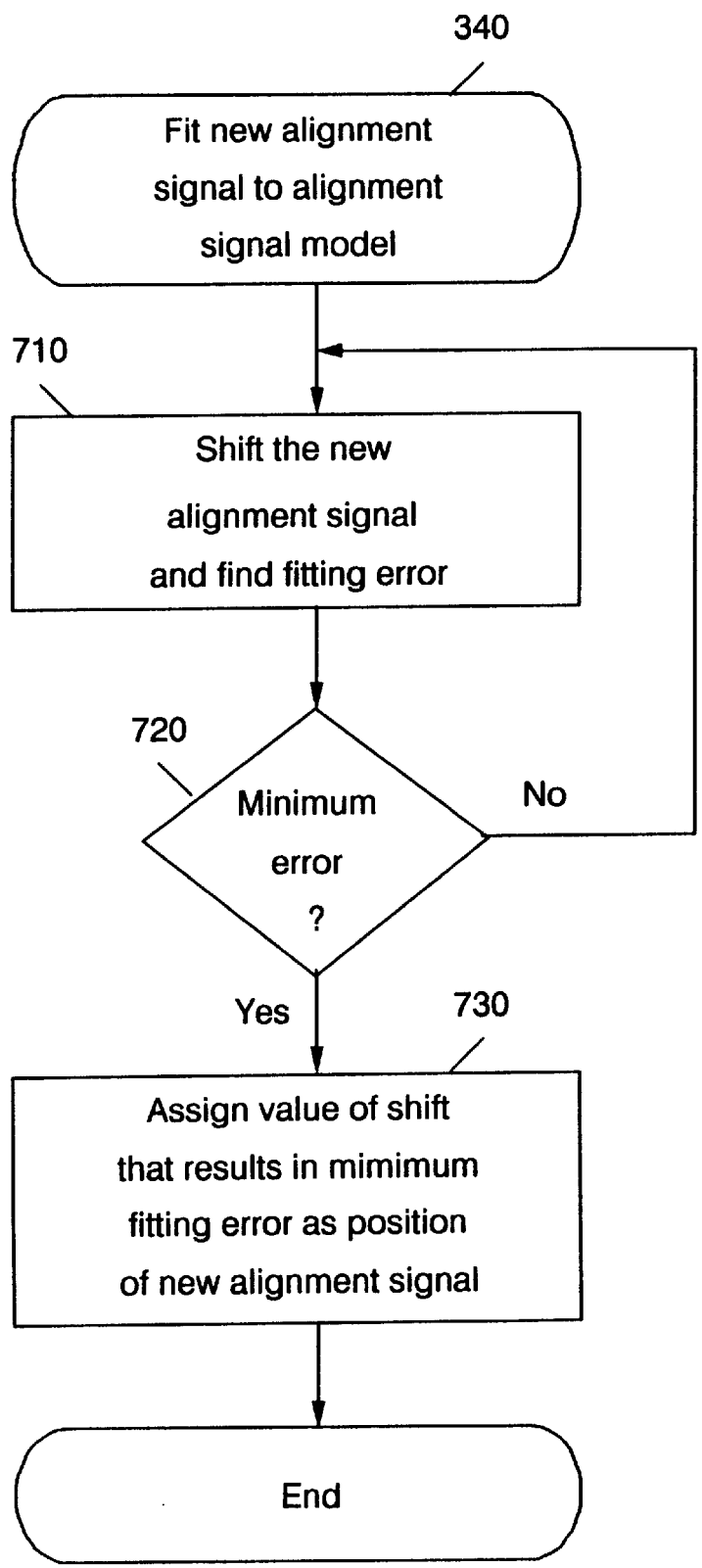

Referring now to FIG. 7, the new alignment signal is fitted to the alignment signal model (Block 340 of FIG. 3). In general, the new alignment signal is shifted and the error of fitting the shifted signal to the alignment signal model (which preferably includes a plurality of base signals, as was described in connection with Block 530) is found. See Block 710 of FIG. 7. More specifically, an error of fitting is determined by determining an error of fitting the shifted new alignment signal to a linear combination of the determined minimum number of base signals that comprise the alignment signal model. Shifting the new alignment signal and finding the error of fitting is repeatedly performed at Block 720 until the minimum fitting error is found. At Block 730, the value of the shift that results in the minimum fitting error is assigned as the position of the new alignment signal. The position of the new alignment mark on the substrate is thereby detected.

More specifically, at Block 710, the general model in Equation (2) can also be rewritten as:

$$a(x - \delta; \mu_1, \ldots, \mu_p) = \sum_{i=0}^{p} \alpha_i a_i(x) + n(x) \quad (9)$$

Therefore, assuming n(x) to be white Gaussian noise, the error may be defined as:

$$E(\delta, \alpha_0, \ldots, \alpha_p) = \int \left| a(x - \delta) - \sum_{i=0}^{p} \alpha_i a_i(x) \right|^2 dx \quad (10)$$

$$= \int \left| A(f) e^{-2j\pi f \delta} - \sum_{i=0}^{p} \alpha_i A_i(f) \right|^2 df$$

where $A(f)$ and $A_i(f)$ are the Fourier transforms of $\alpha(x)$ and $\alpha_i(x)$, respectively. When the signal is sampled, with sampling interval $\Delta$, the error will be:

$$E(\delta, \alpha_0, \ldots, \alpha_p) = \sum_{k=0}^{M-1} \left| A(f_k) e^{-2j\pi f_k \frac{\delta}{\Delta}} - \sum_{i=0}^{p} \alpha_i A_i(f_k) \right|^2 \quad (11)$$

where M is the length of the sampled signals. Defining $A_i$, $i=0, \ldots, p$, and A as the FFT of $a_i$, $i=0, \ldots, p$, and a, respectively, $$B \equiv \text{diag}\left\{ e^{-2j\pi f_0 \frac{\delta}{\Delta}}, \ldots, e^{-2j\pi f_{M-1} \frac{\delta}{\Delta}} \right\},$$

$S \equiv [A_0, \ldots, A_p]$, and $\alpha \equiv [\alpha_0, \ldots, \alpha_p]^T$, produces:

$$E(\delta, \alpha) = \|BA - S\alpha\|^2 \quad (12)$$

Accordingly, fitting error may be defined (Block 710). As shown in Block 720, by minimizing E with respect to $\alpha$:

$$\alpha_{opt} = (S^T S)^{-1} S^T BA \Rightarrow E(\delta) = \left\| (I - S(S^T S)^{-1} S^T) BA \right\|^2 \quad (13)$$

Assume that $\delta$ is such that $$\frac{\delta}{\Delta} \ll 1.$$

This is a valid assumption since the approximate position of the signal may be first found by a coarse algorithm. In this case, B can be linearized using $$e^{-2j\pi f_k \frac{\delta}{\Delta}} \cong 1 - 2j\pi f_k \frac{\delta}{\Delta}$$

and therefore $E(\delta)$ will be a $2^{nd}$ degree polynomial in $\delta$ given by:

$$E(\delta) = \|(I - S(S^T S)^{-1} S^T) B_L A\|^2 \quad (14)$$

where $B_1$ is the linear approximation of B as mentioned before. The position of the signal, $\delta_{opt}$, is measured by minimizing $E(\delta)$. The shift which results in the minimum fitting error is assigned as the position of the new alignment signal (Block 730).

To summarize the fitting of the new alignment signal to the alignment signal model (Block 340), the following operations may be performed:
1. Calculate A and $A_i$, i=0, ..., p, the Fourier transforms of a and $a_i$, i=0, ..., p, where the latter were calculated as described earlier. Also, create S (Block 710).
2. Initialize $\delta_{total} = 0$.
3. Find $\delta$ by minimizing $E(\delta)$ given in Equation (14)
4. A=BA, where $\delta$ in step 3 is used for constructing B (Block 720).
5. $\delta_{total} = \delta_{total}$, go to step 3 (Block 730).

The iteration of Block 720 can stop when there is no significant change in $\delta_{total}$. Also, the iterative part may relax the constraint $\delta/\Delta \ll 1$, so the fit can be obtained even for $\delta/\Delta$ up to unity. Accordingly, the new alignment signal is fitted to the alignment signal model, to thereby identify the position of the new alignment mark.

Simulation

The following simulation results are illustrative and should not be construed as limiting the invention. In order to simulate the present invention, the operations of Blocks 320 and 340 were performed using MATLAB by MathWorks, Inc. The variables p=2, l=20, m=10, M=128, $\Delta$=250 nm, $\sigma$=15 nm were used in the simulation. Low pass-filtered Gaussian functions were used as basis vectors in generating the simulated measurement signals. Two hundred sample alignment signals were then used to find the number of singular values, p+1, and the basis vectors (i.e. to produce the alignment signal models). The alignment signal models were used to find the positions of 100 new alignment signals. Since the signals are band-limited, only the frequency terms in the bandwidth of the signals were considered in finding the position of the new alignment signals. This can reduce high frequency noise effects and can also reduce processing time. In all the simulation examples, less than six iteration steps (Block 720) were needed to detect the position of the new alignment mark.

Table 1 shows the mean and standard deviation of the positioning error and compares them to those for two widely used methods, the Maximum Likelihood method and the Phase Detection method. The latter uses the slope of the phase of the Fourier transform of the signal to find its center of symmetry. As shown in Table 1, an order of magnitude improvement may be obtained in the Standard Deviation (SD) of the error.

TABLE 1

|  | Present Invention | Phase Detection | Maximum Likelihood |
|---|---|---|---|
| Mean (nm) | 0.67 | 35.64 | 21.16 |
| SD (nm) | 5.27 | 38.71 | 29.82 |

The time to compute the position of a new alignment signal generally directly depends on the order of computation that is used by the invention. As described above, there are two overall sets of computation:

1. Calculation of the order of subspace and the basis vectors in the alignment signal model. This need only be performed once for a fabrication process and does not need to be repeated as long as the set-points of the physical parameters of the fabrication process do not change. The computation complexity of this part is $O(M^2m^2)$.
2. Finding the position of a new alignment signal using the alignment signal model may have a computation complexity of $O(M \log(M))$.

Accordingly, a subspace of sample alignment signals from a set of sample alignment signals with preknown positions was found. The position of a new alignment signal was determined based on the fact that, if shifted correctly, the new alignment signal will lie in the same subspace as the sample alignment signals. Since the present invention exploits the structure of the sample alignment signals and the new alignment signal, it can result in more accurate measurement of the position of a new alignment mark. The above-described simulation results have shown that the alignment error can be about an order of magnitude smaller than that achieved with conventional Maximum Likelihood or Phase Fitting approaches. The computational complexity may also increase linearly with the dimension of the subspace and may be linearly proportional to the signal bandwidth.

EXAMPLE

The following Example is illustrative and should not be construed as limiting the invention. Alignment marks that are isolated trenches were etched into silicon wafers. The marks were 2 μm wide and 1 μm deep. A second mask layer was used to introduce short line segments, which straddle one edge of the mark. The width of these line segments was 0.75 μm and they were etched 0.5 μm deep. These line segments serve as deliberately introduced asymmetry in the alignment marks. An optical microscope was used to image the marks on a wafer. The data set comprised 134 images taken from 19 different die. One-dimensional signals are obtained from these images and some signals from the distorted marks are shown in FIGS. 10A–10D. In FIGS. 10A–10D, the vertical scale is arbitrary and the horizontal axis is in units of sampling period. As shown, the signal shape can change significantly from one alignment mark to another, which can be attributed to the variations in the overlay of the two lithography steps.

Figure 11:
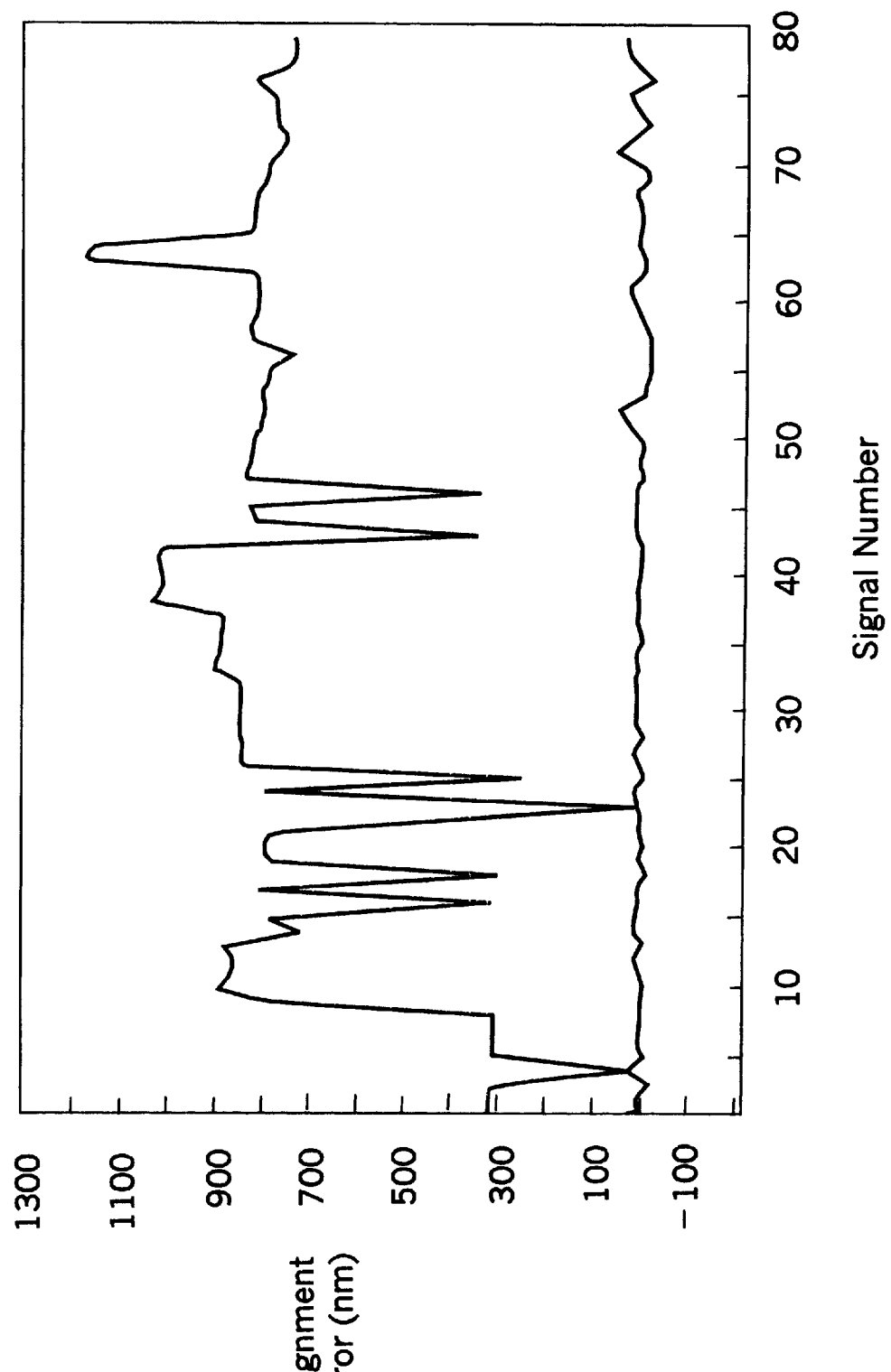
FIG. 11 graphically illustrates alignment performance of a conventional alignment technique and the present invention.

From each image, a conventional technique, assuming symmetric signals and similar to those used on commercial steppers, was used to align to both the undistorted and distorted alignment marks. The center positions given by the undistorted alignment marks were used as the reference positions, which have a 6 nm precision. A set of 55 randomly chosen distorted alignment mark signals was used as sample alignment signals to build the model, which was then used to align the remaining new signals according to the invention. FIG. 11 compares the alignment performance of the conventional technique (dotted line) and the present invention (solid line), the results of which is also summarized in Table 2. As shown, the conventional approach may not be effective with asymmetric signals, while the present invention can properly align asymmetric signals.

TABLE 2

| Alignment Performance | Mean (nm) | Standard Deviation (nm) |
|---|---|---|
| Conventional | 730.9 | 244.5 |
| Invention | 2.1 | 13.9 |

Because the invention employs sample signals as a reference the results should be shift invariant. In other words, when prior signals all shift by the same amount, the alignment performance should not change. Experimentally no change in alignment performance was observed with reference position shifts of up to 200 nm.

The shift-invariance property may provide additional advantages. In particular, the optical microscope used for the Example had uneven illumination, which leads to asymmetry even for the undistorted marks. Because of this asymmetry, the reference positions obtained from the undistorted marks may differ from the real centers of the marks by unknown amounts, which may be referred to as reference errors. However, the shift-invariant property can ensure that the alignment performance does not depend on the reference errors, as long as they remain constant. The marks were positioned at the same location of the image field when taking the images, which render the reference errors approximately constant in all of the reference signals. Therefore, the alignment performance of the invention shown in Table 2 should remain the same if the real centers of the marks are available from overlay data.

Finally, it will be understood that the present invention may be used for both local alignment and global alignment. In particular, as known to those having skill in the art, alignment in wafer steppers can be performed globally and locally. Global alignment can perform rotational and translational alignment of an entire wafer. Local alignment can provide alignment to a target within a particular die that is in position for immediate exposure.

More specifically, in global alignment, also referred to as Enhanced Global Alignment (EGA), a stepper aligns to several alignment marks on a substrate, generally a semiconductor wafer. The number of sites that are used on a substrate may range from four to eight or more. After finding the positions of these alignment marks, the stepper constructs a linear exposure grid. The linear exposure grid may be constructed by a process of linear fitting, to determine rotation, skew, shift and/or scaling.

Present day steppers may only be able to construct a linear exposure grid by performing linear fitting of alignment marks. The linear exposure grid may be characterized by six parameters: x-scaling, y-scaling, rotation, skew (nonorthogonality), x-shift and y-shift. However, due to processing variations, the position of a die on a substrate may not necessarily lie in a linear grid. In other words, nonlinear distortions may be present. The present invention can deal with nonlinear distortions in constructing an exposure grid, to thereby improve accuracy and to account for nonlinear effects.

According to the present invention, for global alignment a set of possible substrate distortion maps (also referred to as wafer distortion maps) is identified for a given process from overlay data of the same substrates from that process; i.e. a sample alignment set. Substrate distortion for the new substrates can be calculated in situ from the measurement of the position of an array of marks across the substrate and finding the closest possible substrate distortion map to fit them.

More specifically, according to the invention, a plurality of substrate distortion maps are obtained from a plurality of sample alignment marks on a plurality of sample substrates. An alignment signal model, also referred to as a distortion map model, is produced from the plurality of substrate distortion maps. A new substrate distortion map is generated from a plurality of new alignment marks on a new substrate. The new substrate distortion map is fitted to the alignment signal model, to thereby perform global alignment for the new substrate.

In determining the position of the plurality of sample marks on a plurality of sample substrates and in determining the position of the new alignment marks on the new substrate, the present invention may be used for local alignment of each of the sample alignment marks and each of the new alignment marks. Moreover, as described above, the present invention may also be used to construct the substrate distortion map.

In particular, according to the present invention, a plurality of alignment marks are present on each substrate. Each of these alignment marks is aligned, for example using local alignment according to the present invention. A linear exposure grid is constructed and exposed. The overlay across the substrate is then measured. A model of the die map is then generated to produce an alignment signal model. The alignment signal model may be produced using singular value decomposition, determination of the number of base signals and assigning the determined base signals as the alignment signal model as described in FIG. 5.

For a new wafer, the plurality of alignment marks is then measured. The techniques according to the present invention may be used on each new alignment mark to obtain a more accurate position determination. From the measured positions, a new substrate distortion map is fit to the alignment signal model that was determined. The positions of all of the die on the substrate can then be found based on this fit. A nonlinear exposure grid can therefore be constructed for improved global alignment.

Figure 12B:
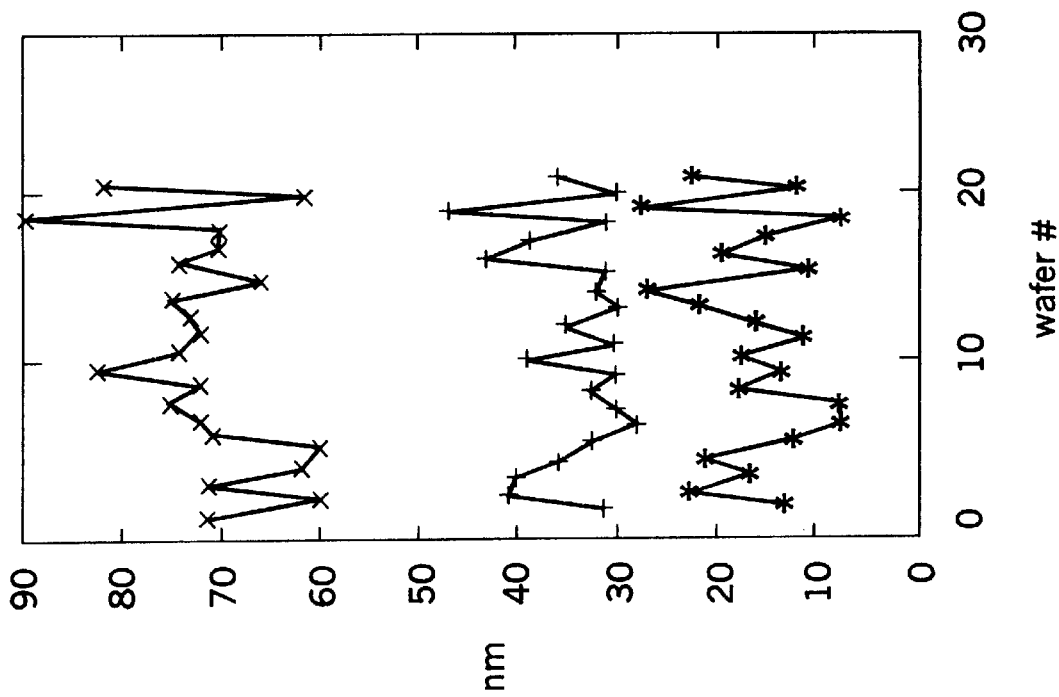
FIGS. 12A and 12B graphically illustrate y and x overlay errors respectively in global alignment according to the present invention.
Figure 12A:
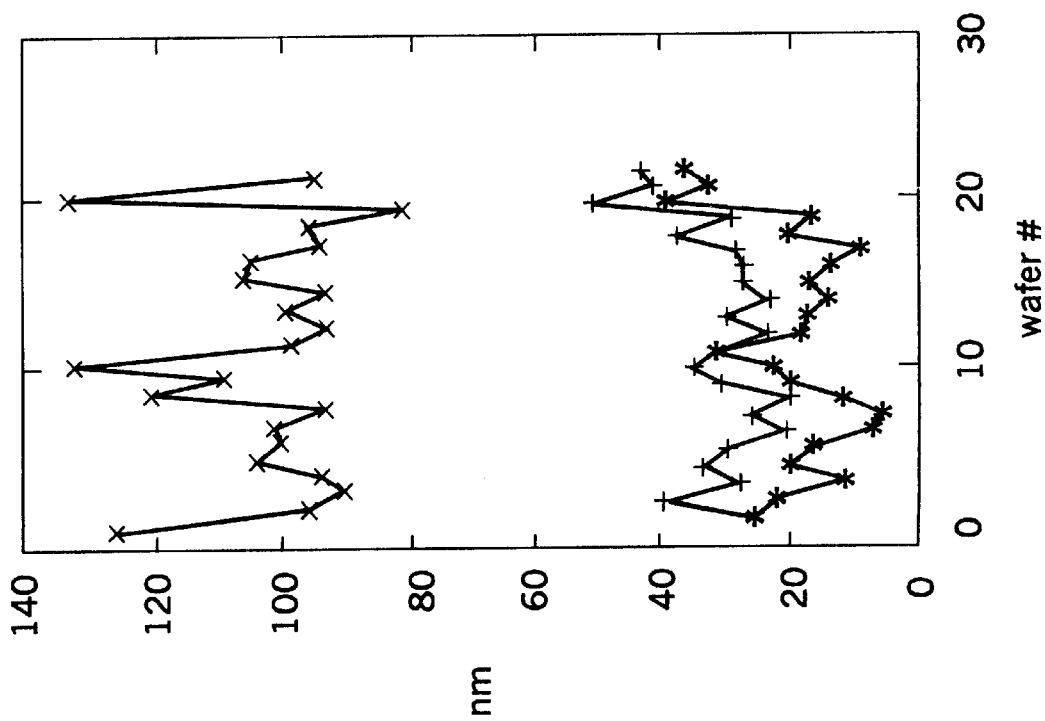
Figure 13B:
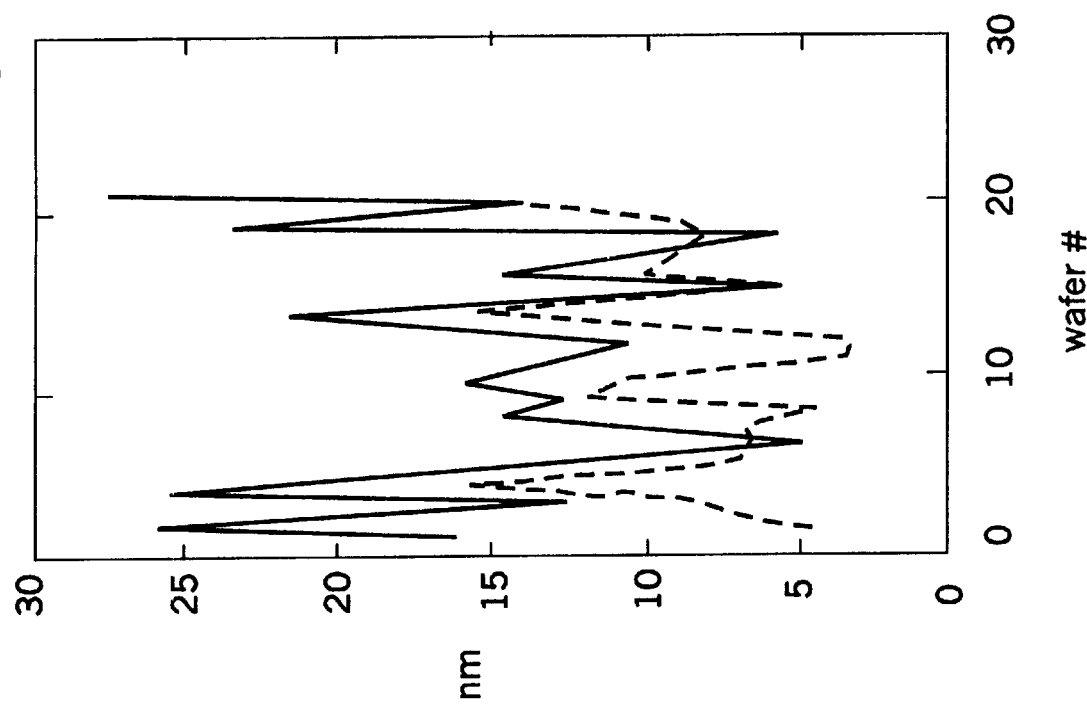
FIGS. 13A and 13B graphically illustrate y and x overlay errors respectively for different wafers according to the present invention.
Figure 13A:
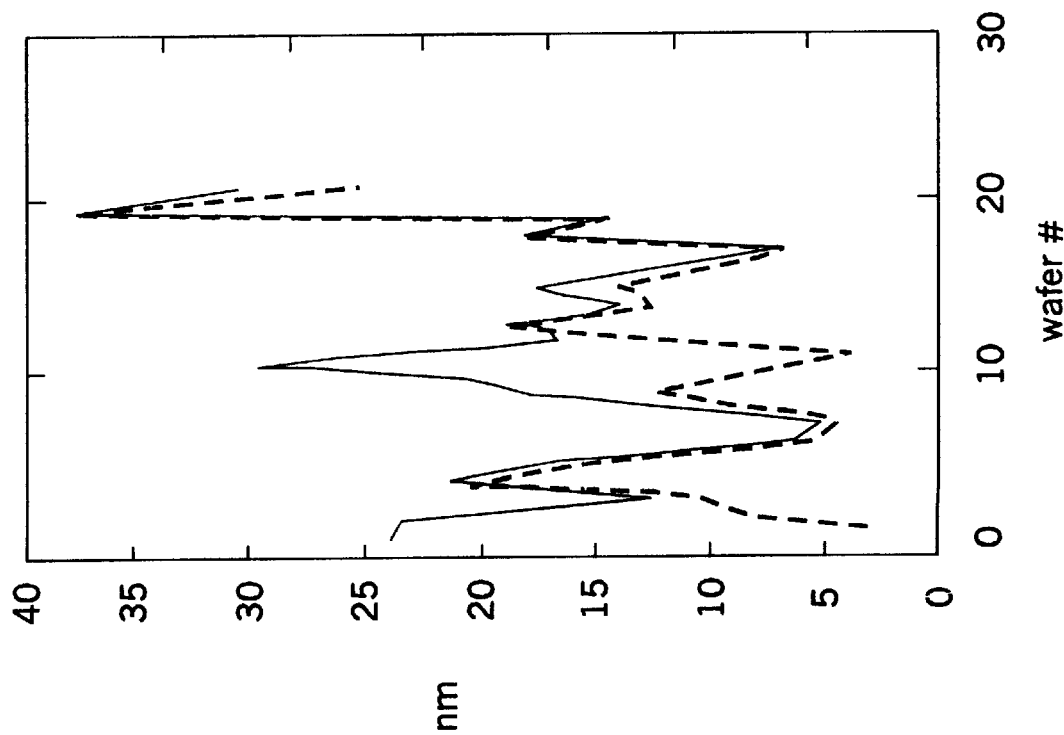

In verifying that the present invention may be used for global alignment, the present invention was applied to the overlay data from Advanced Micro Devices, Inc. Overlay was measured on 9 sites, 5 measurements for each site, and the overlay data was used for 21 wafers from the same process, 10 of which were used for the sample alignment signals. FIGS. 12A and 12B show the impact of removing the mean of only linear distortions (i.e. shift, scaling, rotation, . . . ) and also the mean overlay errors, i.e. 2D vector map, where the latter reduces overlay error by about 70 nm. FIGS. 13A and 13B show the overlay error after adding only two more degrees of freedom to the learning subspace, which further reduces the error by about 30%.

More specifically FIG. 12A indicates y overlay error, and FIG. 12 indicates x overlay error for different wafers of a lot. In these figures, (x) indicates original overlay errors, (+) indicates error after removing the mean of the linear terms and (*) indicates error after removing the mean of overlay error map of the first 10 wafer, i.e. 2D vector map of overlay errors. On average, removing the mean of the linear terms reduces the errors by 38 nm and 73 nm in the x and y directions respectively, while removing the mean of the overlay map reduces the errors by 56 nm and 85 nm.

FIG. 13A indicates y overlay error, and FIG. 13B indicates x overlay error for different wafers of a lot. In these figures, the solid line indicates error after removing the mean of overlay error map of the first 10 wafers. The dashed line indicates error after learning the wafer distortion from the first 10 wafers and then estimating the distortion for all the wafers. On average, the error is reduced by 6.2 nm and 5.6 nm in x and y directions respectively, which corresponds to about 30 percent reduction in the overlay error. Accordingly, the present invention may be used for global alignment as well as for local alignment.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of detecting a position of a new alignment mark on a substrate, comprising the steps of:

obtaining a plurality of sample alignment signals from a plurality of sample alignment marks;

producing an alignment signal model from the plurality of sample alignment signals;

generating a new alignment signal from the new alignment mark; and fitting the new alignment signal to the alignment signal model to thereby identify the position of the new alignment mark on the substrate.

2. A method according to claim 1:

wherein the obtaining step comprises the steps of:

forming the plurality of sample alignment marks having a shape on at least one substrate;

processing the plurality of sample alignment marks having the shape according to a fabrication process to produce a coating on the sample alignment marks; and imaging the plurality of sample alignment marks including the coating, to generate the plurality of sample alignment signals; and wherein the generating step comprises the steps of:

forming the new alignment mark having the shape on a substrate;

processing the new alignment mark having the shape according to the fabrication process to produce the coating on the new alignment mark; and imaging the new alignment mark including the coating, to generate the new alignment signal.

3. A method according to claim 2:

wherein the step of imaging the plurality of sample alignment marks comprises the step of scanning the plurality of sample alignment marks including the coating, using scanning parameters, to generate the plurality of sample alignment signals; and wherein the step of imaging the new alignment mark comprises the step of scanning the new alignment mark including the coating, using the scanning parameters, to generate the new alignment signal.

4. A method according to claim 2 wherein the plurality of sample alignment marks and the new alignment mark are symmetrical and wherein the coating is asymmetrical, such that the plurality of sample alignment signals and the new alignment signal are asymmetrical.

5. A method according to claim 1 wherein the substrate is an integrated circuit substrate and wherein the new alignment mark is a pattern on the integrated circuit substrate.

6. A method according to claim 1:
wherein the producing step comprises the step of producing an alignment signal model including a known position identification from the plurality of sample alignment signals; and
wherein the fitting step comprises the step of fitting the new alignment signal to the alignment signal model to thereby identify the position of the new alignment mark on the substrate from the known position identification.

7. A method according to claim 1 wherein the producing step comprises the steps of:
computing a singular value decomposition of the plurality of sample alignment signals to thereby produce a plurality of base signals;
determining a number of base signals that construct the sample alignment signals; and
selecting the determined number of base signals from the plurality of base signals as the alignment signal model.

8. A method according to claim 7:
wherein the computing step comprises the step of computing a singular value decomposition of the plurality of sample alignment signals to thereby produce a plurality of base signals in descending order of importance;
wherein the determining step comprises the step of determining a minimum number of base signals that construct the sample alignment signals; and
wherein the selecting step comprises the step of selecting the determined minimum number of base signals from the plurality of base signals, beginning with the first base signal, as the alignment signal model.

9. A method according to claim 7 wherein the fitting step comprises the steps of:
shifting the new alignment signal;
determining an error of fitting the shifted new alignment signal to the alignment signal model;
repeating the shifting and determining steps to determine a minimum error of fitting; and
identifying a position of the shifted new alignment signal having a minimum error of fitting as the position of the new alignment mark on the substrate.

10. A method according to claim 9 wherein the step of determining an error of fitting the shifted new alignment signal to the alignment signal model comprises the step of determining an error of fitting the shifted new alignment signal to a linear combination of the determined number of base signals that comprise the alignment signal model.

11. A method according to claim 1:
wherein the obtaining step comprises the step of obtaining a plurality of substrate distortion maps from a plurality of sample alignment marks on a plurality of sample substrates;
wherein the producing step comprises the step of producing an alignment signal model from the plurality of substrate distortion maps;
wherein the generating step comprises the step of generating a new substrate distortion map from a plurality of new alignment marks on a new substrate; and wherein the fitting step comprises the step of fitting the new substrate distortion map to the alignment signal model to thereby perform global alignment for the new substrate.

12. A method of detecting a position of a new alignment mark on a substrate, the method comprising the steps of:
providing an alignment signal model;
generating a new alignment signal from the new alignment mark; and
fitting the new alignment signal to the alignment signal model to thereby identify the position of the new alignment mark on the substrate.

13. A method according to claim 12 wherein the generating step comprises the steps of:
forming a new alignment mark on the substrate;
processing the new alignment mark according to a fabrication process to produce a coating on the new alignment mark; and
imaging the new alignment mark including the coating, to generate the new alignment signal.

14. A method according to claim 13 wherein the substrate is an integrated circuit substrate and wherein the new alignment mark is a pattern on the integrated circuit substrate.

15. A method according to claim 12 wherein the fitting step comprises the steps of:
shifting the new alignment signal;
determining an error of fitting the shifted new alignment signal to the alignment signal model;
repeating the shifting and determining steps to determine a minimum error of fitting; and
identifying the position of the shifted new alignment signal having a minimum error of fitting as the position of the new alignment mark on the substrate.

16. A method according to claim 12:
wherein the providing step comprises the step of providing a substrate distortion map model;
wherein the generating step comprises the step of generating a new substrate distortion map from a plurality of new alignment marks on a new substrate; and
wherein the fitting step comprises the step of fitting the new substrate distortion map to the substrate distortion map model to thereby perform global alignment for the new substrate.

17. A system for detecting a position of a new alignment mark on a substrate comprising:
means for obtaining a plurality of sample alignment signals from a plurality of sample alignment marks, and a new alignment signal from the new alignment mark;
means for producing an alignment signal model from the plurality of sample alignment signals; and
means for fitting the new alignment signal to the alignment signal model to thereby identify the position of the new alignment mark on the substrate.

18. A system according to claim 17 wherein the obtaining means comprises means for imaging the plurality of sample alignment marks to generate the plurality of sample alignment signals, and imaging the new alignment mark to generate the new alignment signal.

19. A system according to claim 18 wherein the means for imaging comprises means for scanning the plurality of sample alignment marks using scanning parameters, to generate the plurality of sample alignment signals and for scanning the new alignment mark using the scanning parameters, to generate the new alignment signal.

20. A system according to claim 17 wherein the plurality of sample alignment signals and the new alignment signal are asymmetrical.

21. A system according to claim 17:
wherein the means for producing comprises means for producing an alignment signal model including a known position identification from the plurality of sample alignment signals; and
wherein the means for fitting comprises means for fitting the new alignment signal to the alignment signal model to thereby identify the position of the new alignment mark on the substrate from the known position identification.

22. A system according to claim 17 wherein the means for producing comprises:
means for computing a singular value decomposition of the plurality of sample alignment signals to thereby produce a plurality of base signals;
means for determining a number of base signals that construct the sample alignment signals; and
means for selecting the determined number of base signals from the plurality of base signals as the alignment signal model.

23. A system according to claim 22:
wherein the means for computing comprises means for computing a singular value decomposition of the plurality of sample alignment signals to thereby produce a plurality of base signals in descending order of importance;
wherein the means for determining comprises means for determining a minimum number of base signals that construct the sample alignment signals; and
wherein the means for selecting comprises means for selecting the determined minimum number of base signals from the plurality of base signals, beginning with the first base signal, as the alignment signal model.

24. A system according to claim 22 wherein the means for fitting comprises:
means for repeatedly shifting the new alignment signal;
means for repeatedly determining an error of fitting the shifted new alignment signal to the alignment signal model; and
means for identifying a position of the shifted new alignment signal having a minimum error of fitting as the position of the new alignment mark on the substrate.

25. A system according to claim 24 wherein the means for determining an error of fitting the shifted new alignment signal to the alignment signal model comprises means for determining an error of fitting the shifted new alignment signal to a linear combination of the determined number of base signals that comprise the alignment signal model.

26. A system according to claim 17:
wherein the obtaining means comprises means for obtaining a plurality of substrate distortion maps from a plurality of sample alignment marks on a plurality of sample substrates;
wherein the producing means comprises means for producing an alignment signal model from the plurality of substrate distortion maps;
wherein the generating means comprises means for generating a new substrate distortion map from a plurality of new alignment marks on a new substrate; and
wherein the fitting means comprises means for fitting the new substrate distortion map to the alignment signal model to thereby perform global alignment for the new substrate.

27. A system for detecting a position of a new alignment mark on a substrate, the system comprising:
means for generating a new alignment signal from the new alignment mark; and
means for fitting the new alignment signal to an alignment signal model to thereby identify the position of the new alignment mark on the substrate.

28. A system according to claim 27 wherein the means for generating comprises means for imaging the new alignment mark to generate the new alignment signal.

29. A system according to claim 28 wherein the substrate is an integrated circuit substrate and wherein the new alignment mark is a pattern on the integrated circuit substrate.

30. A system according to claim 28 wherein the means for fitting comprises:
means for repeatedly shifting the new alignment signal;
means for repeatedly determining an error of fitting the shifted new alignment signal to the alignment signal model; and
means for identifying a position of the shifted new alignment signal having a minimum error of fitting as the position of the new alignment mark on the substrate.

31. A system according to claim 30 wherein the alignment signal comprises a plurality of base signals and wherein the means for repeatedly determining an error of fitting the shifted new alignment signal to the alignment signal model comprises means for determining an error of fitting the shifted new alignment signal to a linear combination of the plurality of base signals.

32. A system according to claim 27:
wherein the generating means comprises means for generating a new substrate distortion map from a plurality of new alignment marks on a new substrate; and
wherein the fitting means comprises means for fitting the new substrate distortion map to a substrate distortion map model to thereby perform global alignment for the new substrate.

33. A computer program product for determining a position of a new alignment mark on a substrate, the computer program product comprising a computer-readable storage medium having computer-readable program code means embodied in the medium, the computer-readable program code means comprising:
computer-readable program code means for obtaining a plurality of sample alignment signals from a plurality of sample alignment marks, and a new alignment signal from the new alignment mark;
computer-readable program code means for producing an alignment signal model from the plurality of sample alignment signals; and
computer-readable program code means for fitting a new alignment signal to the alignment signal model to thereby identify the position of the new alignment mark on the substrate.

34. A computer program product according to claim 33 wherein the obtaining means comprises computer-readable program code means for imaging the plurality of sample alignment marks to generate the plurality of sample alignment signals, and imaging the new alignment mark to generate the new alignment signal.

35. A computer program product according to claim 34 wherein the means for imaging comprises computer-readable program code means for scanning the plurality of sample alignment marks using scanning parameters, to generate the plurality of sample alignment signals and for scanning, the new alignment mark using the scanning parameters, to generate the new alignment signal.

36. A computer program product according to claim 33 wherein the plurality of sample alignment signals and the new alignment signal are asymmetrical.

37. A computer program product according to claim 33:
wherein the means for producing comprises computer-readable program code means for producing an alignment signal model including a known position identification from the plurality of sample alignment signals; and
wherein the means for fitting comprises computer-readable program code means for fitting the new alignment signal to the alignment signal model to thereby identify the position of the new alignment mark on the substrate from the known position identification.

38. A computer program product according to claim 33 wherein the means for producing comprises:
computer-readable program code means for computing a singular value decomposition of the plurality of sample alignment signals to thereby produce a plurality of base signals;
computer-readable program code means for determining a number of base signals that construct the sample alignment signals; and
computer-readable program code means for selecting the determined number of base signals from the plurality of base signals as the alignment signal model.

39. A computer program product according to claim 38:
wherein the means for computing comprises computer-readable program code means for computing a singular value decomposition of the plurality of sample alignment signals to thereby produce a plurality of base signals in descending order of importance;
wherein the means for determining comprises computer-readable program code means for determining a minimum number of base signals that construct the sample alignment signals; and
wherein the means for selecting comprises computer-readable program code means for selecting the determined minimum number of base signals from the plurality of base signals, beginning with the first base signal, as the alignment signal model.

40. A computer program product according to claim 38 wherein the means for fitting comprises:
computer-readable program code means for repeatedly shifting the new alignment signal;
computer-readable program code means for repeatedly determining an error of fitting the shifted new alignment signal to the alignment signal model; and
computer-readable program code means for identifying a position of the shifted new alignment signal having a minimum error of fitting as the position of the new alignment mark on the substrate.

41. A computer program product according to claim 40 wherein the means for determining an error of fitting the shifted new alignment signal to the alignment signal model comprises computer-readable program code means for determining an error of fitting the shifted new alignment signal to a linear combination of the determined number of base signals that comprise the alignment signal model.

42. A computer program product according to claim 33:
wherein the obtaining means comprises means for obtaining a plurality of substrate distortion maps from a plurality of sample alignment marks on a plurality of sample substrates;
wherein the producing means comprises means for producing an alignment signal model from the plurality of substrate distortion maps; and
wherein the fitting means comprises means for fitting a new substrate distortion map to the alignment signal model to thereby perform global alignment for the new substrate.

43. A computer program product for detecting a position of a new alignment mark on a substrate, the computer program product comprising a computer-readable storage medium having computer-readable program code means embodied in the medium, the computer-readable program code means comprising:
computer-readable program code means for generating a new alignment signal from the new alignment mark; and
computer-readable program code means for fitting the new alignment signal to an alignment signal model to thereby identify the position of the new alignment mark on the substrate.

44. A computer program product according to claim 43 wherein the means for generating comprises computer-readable program code means for imaging the new alignment mark to generate the new alignment signal.

45. A computer program product according to claim 44 wherein the substrate is an integrated circuit substrate and wherein the new alignment mark is a pattern on the integrated circuit substrate.

46. A computer program product according to claim 43 wherein the means for fitting comprises:
computer-readable program code means for repeatedly shifting the new alignment signal;
computer-readable program code means for repeatedly determining an error of fitting the shifted new alignment signal to the alignment signal model; and
computer-readable program code means for identifying a position of the shifted new alignment signal having a minimum error of fitting as the position of the new alignment mark on the substrate.

47. A computer program product according to claim 46 wherein the alignment signal comprises a plurality of base signals and wherein the means for repeatedly determining an error of fitting the shifted new alignment signal to the alignment signal model comprises computer-readable program code means for determining an error of fitting the shifted new alignment signal to a linear combination of the plurality of base signals.

48. A computer program product according to claim 43:
wherein the generating means comprises means for generating a new substrate distortion map from a plurality of new alignment marks on a new substrate; and
wherein the fitting means comprises means for fitting the new substrate distortion map to a substrate distortion map model to thereby perform global alignment for the new substrate.

* * * * *